(12) United States Patent
Demin et al.

(10) Patent No.: US 9,136,230 B2
(45) Date of Patent: Sep. 15, 2015

(54) IC PACKAGE WITH INTEGRATED WAVEGUIDE LAUNCHER

(71) Applicant: Broadcom Corporation, Irvine, CA (US)

(72) Inventors: Sergei Demin, Nesher (IL); Shaul Klein, Magal (IL); Igal Yehuda Kushnir, Azur (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/852,411

(22) Filed: Mar. 28, 2013

(65) Prior Publication Data

US 2014/0291835 A1 Oct. 2, 2014

(51) Int. Cl.
*H01L 23/498* (2006.01)
*H01L 23/66* (2006.01)
*H01P 3/00* (2006.01)
*H01P 5/107* (2006.01)
*H05K 1/02* (2006.01)

(52) U.S. Cl.
CPC *H01L 23/66* (2013.01); *H01P 3/00* (2013.01); *H01P 5/107* (2013.01); *H01L 2224/16225* (2013.01); *H01L 2224/16235* (2013.01); *H01L 2224/32225* (2013.01); *H01L 2224/48227* (2013.01); *H01L 2224/48235* (2013.01); *H01L 2224/73204* (2013.01); *H01L 2224/73265* (2013.01); *H01L 2924/15159* (2013.01); *H01L 2924/15311* (2013.01); *H05K 1/0243* (2013.01); *H05K 2201/09072* (2013.01)

(58) Field of Classification Search
CPC ........... H01P 5/107; H01P 7/06; H01P 3/081; H01P 3/121; H01P 11/002; H01L 2223/6627; H01L 2924/1423; H01L 2223/6677; H01Q 1/12; H01Q 1/1214; H01Q 1/122; H01Q 1/2283; H01Q 13/02; H01Q 13/0233
USPC ...................... 257/81–84, 98, 99; 333/4, 103, 333/245–248; 438/404, 917; 343/700 MS
See application file for complete search history.

(56) References Cited

U.S. PATENT DOCUMENTS

| | | | |
|---|---|---|---|
| 6,462,938 B1 * | 10/2002 | Horne et al. | 361/679.28 |
| 7,372,408 B2 * | 5/2008 | Gaucher et al. | 343/700 MS |
| 2005/0068261 A1 * | 3/2005 | Oh | 345/60 |
| 2005/0122255 A1 * | 6/2005 | Shmuel | 342/175 |
| 2008/0266196 A1 * | 10/2008 | Shi | 343/772 |
| 2009/0057888 A1 * | 3/2009 | Hunter | 257/737 |
| 2009/0206473 A1 * | 8/2009 | Lopez et al. | 257/728 |
| 2011/0273351 A1 * | 11/2011 | Johnson | 343/770 |
| 2011/0299256 A1 * | 12/2011 | Leiba et al. | 361/752 |
| 2012/0051000 A1 * | 3/2012 | Laidig et al. | 361/736 |
| 2013/0329353 A1 * | 12/2013 | Savory et al. | 361/679.33 |

* cited by examiner

*Primary Examiner* — Jae Lee
*Assistant Examiner* — Mohammed R Alam
(74) *Attorney, Agent, or Firm* — Sterne, Kessler, Goldstein & Fox P.L.L.C.

(57) ABSTRACT

Embodiments described herein include an integrated circuit (IC) device. For example, the IC device can include a substrate configured to be coupled to a printed circuit board (PCB), an IC die attached to the substrate, and a waveguide launcher formed on the substrate. The waveguide launcher is electrically coupled to the IC die through the substrate.

20 Claims, 10 Drawing Sheets

IC PACKAGE WITH INTEGRATED WAVEGUIDE LAUNCHER

BACKGROUND

1. Field

Embodiments described herein generally relate to integrated circuit devices and packages.

2. Background

Integrated circuit (IC) dies can be used to implement a variety of types of functionality, e.g., microprocessors, field programmable gate arrays (FPGAs), memories, etc. To provide protection for the IC die, the die can be included in an IC package. The IC package can be mounted on to a printed circuit board (PCB). The PCB can also have other components and devices mounted thereon. The IC package's solder balls can provide for electrical interconnection between the IC package and the PCB.

Many PCBs also have waveguide components. For example, the PCB can include a waveguide launcher that radiates into and receives radiation from a waveguide. The PCB can include low-loss dielectric materials to decrease insertion loss into the waveguide launcher. These low-loss materials, however, can be expensive. Moreover, the distance and the number of junctions between the IC die and the waveguide launcher can also increase insertion loss.

BRIEF DESCRIPTION OF THE DRAWINGS/FIGURES

The accompanying drawings, which are incorporated herein and form a part of the specification, illustrate the disclosed subject matter and, together with the description, further serve to explain the principles of the contemplated embodiments and to enable a person skilled in the pertinent art to make and use the contemplated embodiments.

The disclosed subject matter will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

In embodiments described herein, an integrated circuit (IC) device is provided. The IC device can include a substrate, and IC die, and a waveguide launcher. The substrate can be configured to be coupled to a printed circuit board (PCB). The IC die can be attached to the substrate. The waveguide launcher can be formed on the substrate and electrically coupled to the IC die through the substrate.

For example, in an embodiment, the IC device can be a flip chip ball grid array (FCBGA) package including bumps that electrically couple to the IC die to the substrate. The substrate can be a multilayer substrate that includes multiple metal layers separated by dielectric material. One or more vias formed in the substrate can electrically couple the IC die to a patterned metal layer formed in the substrate. This patterned metal layer can electrically couple the IC die to the waveguide launcher.

The waveguide launcher can include a pair of metal traces. The first metal trace, which can be approximately a quarter wavelength long, can electrically couple the IC die to the second metal trace. The second metal trace can be a launch pad that is also approximately a quarter wavelength long and which radiates into and receives radiation from a waveguide. In a further embodiment, the substrate can include a cavity in which the waveguide launcher is formed. The cavity can be approximately a quarter wavelength deep. A ground ring surrounding the cavity can be formed in the IC device. The ground ring can include one or more metal traces that are electrically coupled to one or more solder balls, each of which is coupled to a ground potential.

The IC device can be coupled to a PCB. Moreover, the PCB can be coupled to a chassis and/or a housing. The chassis can include a cavity that substantially corresponds with the cavity of the substrate, so that an outline of the chassis cavity substantially mirror a corresponding outline of the substrate cavity. The housing can include a waveguide that is configured to guide radiation to and from the waveguide launcher. In addition, the housing can also include a heat spreader that is in thermal contact with the IC die.

Figure 1:
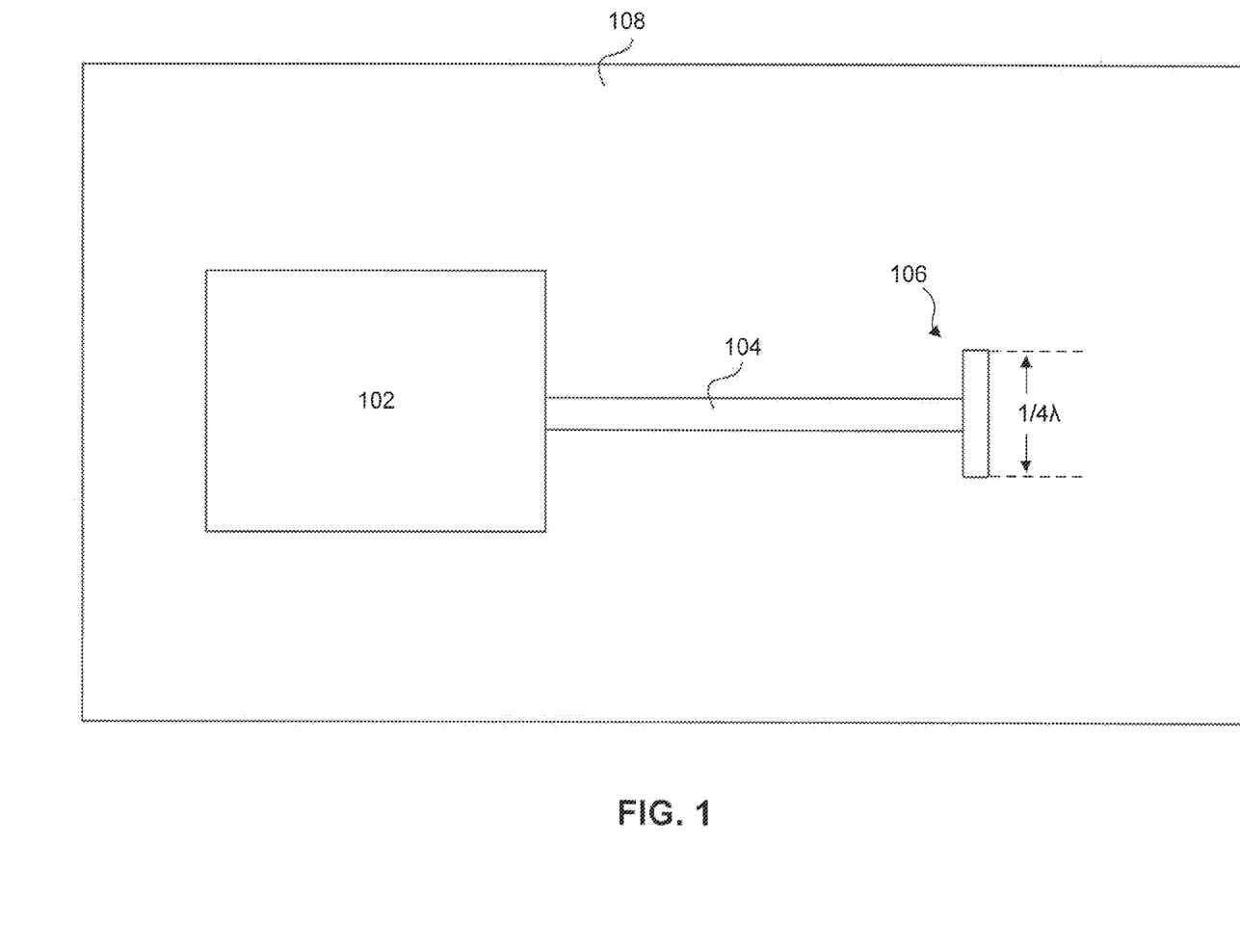
FIGS. 1-2 show a top view and a cross-sectional view of an IC device, according to embodiments.

FIG. 1 shows a top view of an IC device 100, according to an embodiment. In an embodiment, IC device 100 can be used in outdoor units. For example, IC device 100 can be included in a point-to-point or point-to-multipoint transceiver.

IC device 100 includes an IC die 102, a metal trace 104, a waveguide launcher 106, and a substrate 108. IC die 102 can be formed out of a variety of materials used to form IC dies and can perform a variety of functions. For example, IC die 102 can be formed out of silicon. IC die 102 can include one or more of a microprocessor, and application specific integrated circuit (ASIC), a memory, or a field programmable gate array (FPGA).

As shown in FIG. 1, metal trace 104 and waveguide launcher 106 can be formed on the top surface of substrate 108. In an embodiment, metal trace 104 and waveguide launcher 106 can be formed using standard metal trace forming techniques known to those skilled in the relevant arts. Metal trace 104 and waveguide launcher 106 can be formed out of a variety of different materials used to form metal traces in IC devices, e.g., copper or aluminum. In FIG. 1, IC die 102 is shown as being electrically coupled to waveguide launcher 106 through metal trace 104. As will be described in greater detail below, however, IC die 102 can be electrically coupled to waveguide launcher 106 using a variety of elements. For example, IC die 102 can also be coupled to waveguide launcher 106 through a combination of one or more of vias, metal traces, or patterned metal layers.

The frequency of operation of waveguide launcher 106 can be in the GHz range, e.g., 10-20 GHz. In an embodiment, the length of waveguide launcher 106 is approximately a quarter wavelength at the frequency of interest. In other embodiments, however, different lengths can instead be used, e.g., half wavelengths.

By including waveguide launcher 106 within the package itself, power losses can be greatly diminished. For example, the distance between IC die 102 and waveguide launcher 106 is one of the factors that cause power loss. By including waveguide launcher 106 in the package itself, the distance between IC die 102 and waveguide launcher 106 is decreased. Moreover, another factor is the number of interconnections between IC die 102 and waveguide launcher 106. By including waveguide launcher 106 in the package, the number of interconnections between IC die 102 and waveguide launcher 106 are greatly reduced.

Substrate 108 can be formed out of a low loss material at the frequency of operation of waveguide launcher 106, e.g., high frequency laminates or polyimides. For example, substrate 108 can be formed out of material that has a dielectric permittivity of approximately 3.4. By including waveguide launcher 106 in IC device 100, only substrate 100 (instead of the entirety of a PCB) can be formed out of low-loss materials, thereby reducing cost.

Figure 2:
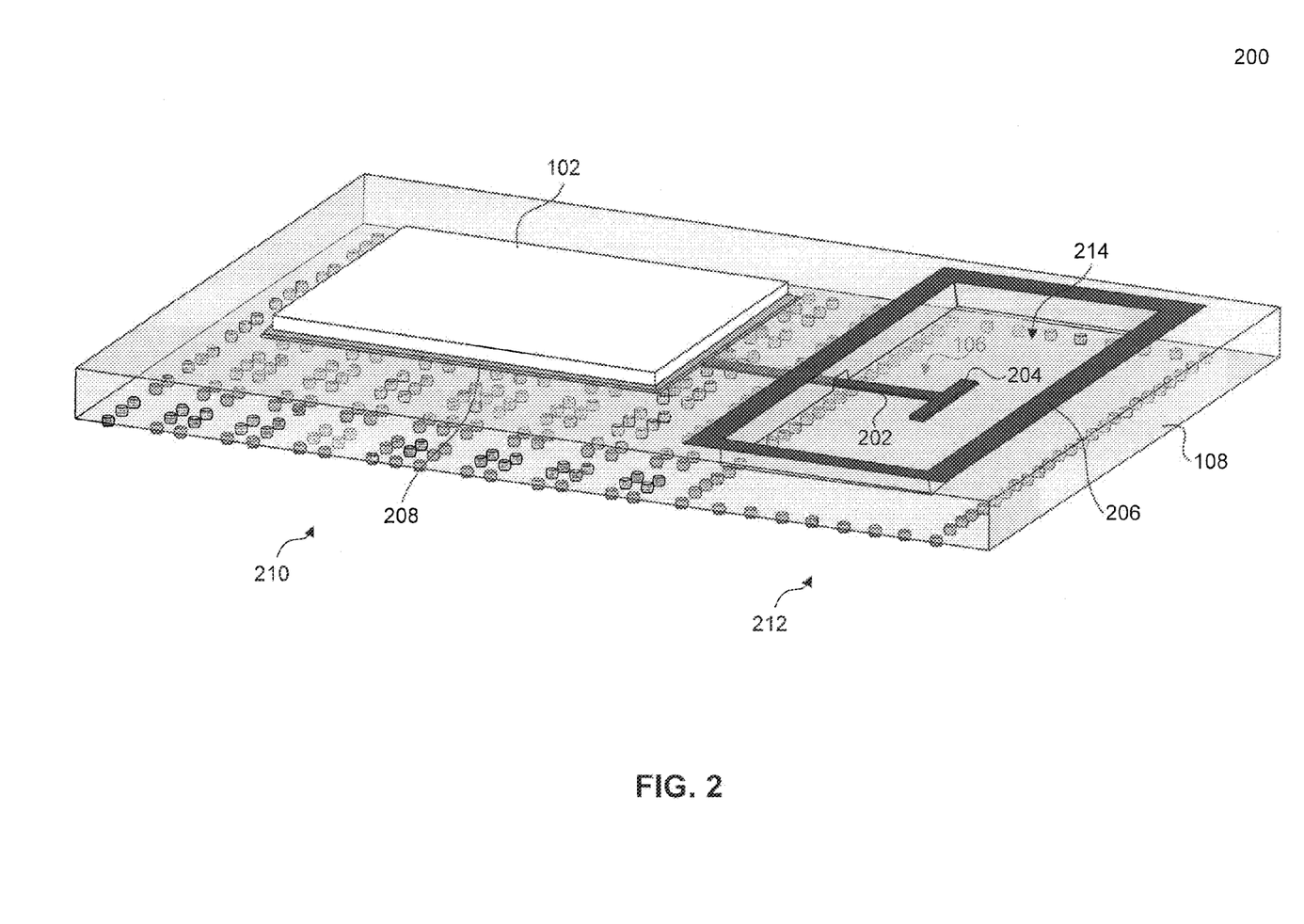

FIG. 2 shows a perspective view of an IC device 200, according to an embodiment. IC device 200 includes IC die 102, waveguide launcher 106, substrate 108, an underfill material 208, and solder balls 210. In an embodiment, the total thickness of package 200 is approximately 1 millimeter.

Underfill material 208 attaches IC die 102 to the top surface of substrate 108. Underfill material 208 can be one of a variety of different underfill materials that are used to couple IC dies to substrates, e.g. an epoxy, an encapsulation material, or a mold.

As shown in FIG. 2, waveguide launcher 106 includes a first portion 202 and a second portion 204. In an embodiment, both first and second portions 202 and 204 are approximately a quarter wavelength long and are perpendicular to each other. In an embodiment, first portion 202 can be used to deliver signals to and receive signals from IC die 102. Second portion 204 can operate as a launch pad that radiate electromagnetic waves based on the received signal.

As show in FIG. 2, waveguide launcher 106 is formed within a cavity 214 of substrate 108. In an embodiment, cavity 214 can be used to enhance radiating properties for relatively low frequency signals. The depth of cavity 214 can be approximately a quarter wavelength at the frequency of interest. Thus, as the frequency of operation increases and the wavelength decreases, the depth of cavity 214 can decrease. The length and width of cavity 214 can also depend on the frequency of operation. For example, cavity 214 can have dimensions equal to those of a waveguide that is used to propagate a signal of a given frequency. As shown in FIG. 2, cavity 214 has a rectangular cross section. However, in alternate embodiments, cavity 214 may have other shapes, including elliptical and circular.

Cavity 214 can be an air filled cavity. In alternate embodiments, cavity 214 can be filled with a dielectric material having a permittivity that is greater than the permittivity of air. Filling cavity 214 with such a dielectric material can reduce the depth of cavity 214 for a given frequency of operation. As shown, the waveguide launcher 106 is formed on a floor or bottom surface of the cavity. If dielectric material is used, then the waveguide launcher 106 could be suspended in the dielectric material, and therefore off the floor of the cavity 214.

As shown in FIG. 2, solder balls 210 are formed on the bottom surface of substrate 108. In an embodiment, specific ones of solder balls 210 can facilitate communications between IC die 102 and other devices that are mounted on a PCB. For example, solder balls 210 can be coupled to respective conductive regions formed on a PCB. Through these conductive regions, IC die 102 can be coupled to other components. IC die 102 can be electrically coupled to solder balls 210 through one or more of vias, metal traces, or patterned metal layers.

Ground ring 206 is formed on the top surface of substrate 108 and surrounds cavity 214. Ground ring 206 can be formed out of one or more metallic traces formed on the surface of substrate 108. Ground ring 206 can be electrically coupled to respective solder balls 212 that form a corresponding fence on the bottom surface of substrate 108. In other words, solder balls 212 of solder balls 210 are arranged in a shape that corresponds to the shape of ground ring 206. In a further embodiment, substrate 108 can include one or more vias, metal traces, or patterned metal layers that electrically couple solder balls 212 to ground ring 206.

Figure 3:
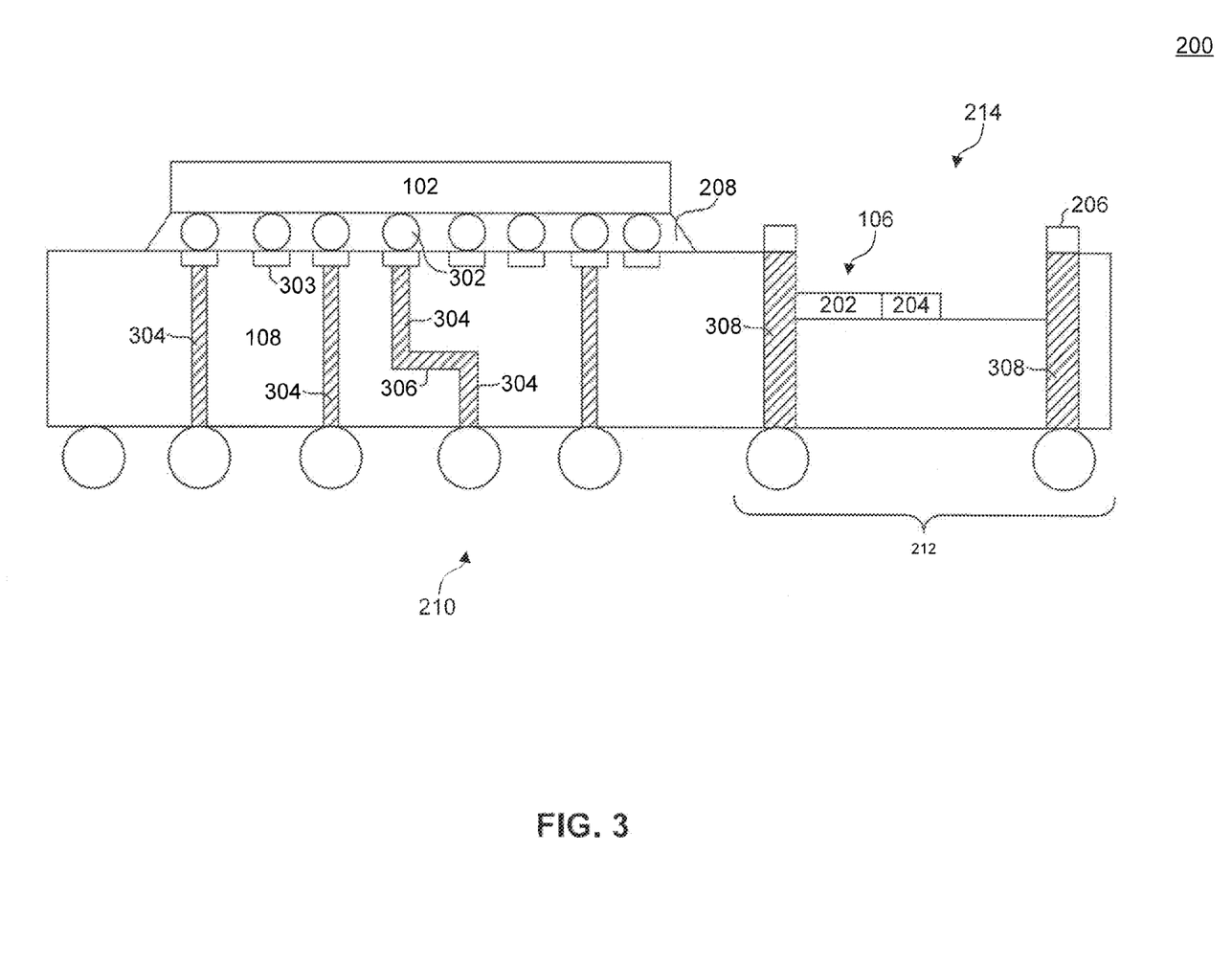
FIGS. 3-4 show cross-sectional views of IC devices, according to embodiments.

FIG. 3 shows a cross sectional diagram of IC device 200, according to an embodiment. As shown in FIG. 3, IC die 102 is coupled to substrate 108 in a flip chip configuration. For example, in FIG. 3, IC die 102 is coupled to substrate 108 through solder bumps 302. Each one of solder bumps 302 is attached to a respective conductive region 303 on substrate 108. Each one of conductive regions 303 is coupled to a respective one of solder balls 210 through a respective one of vias 304 and/or a respective one of metal traces 306.

Also as shown in FIG. 3, ground ring 206 is coupled to solder balls 212 through vias 308. Vias 308 may have a smaller pitch than vias 304 to accommodate a greater density of solder balls. Although the embodiment of FIG. 3 shows corrections directly through vias 308, those skilled in the relevant art will appreciate that connections between ground ring 206 and solder balls 212 can also include one or more metal traces or patterned metal layers.

Figure 4:
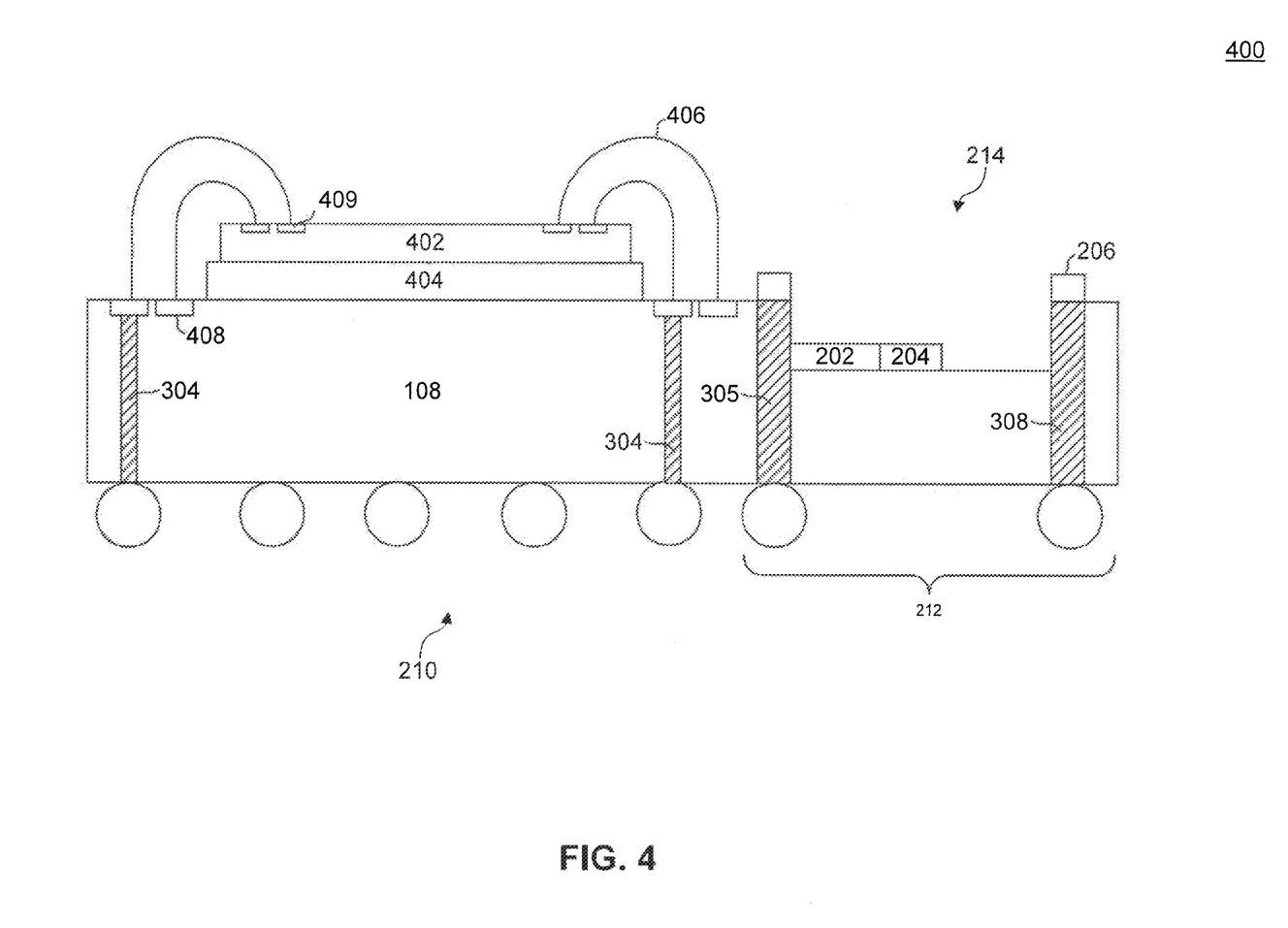

FIG. 4 shows a cross sectional diagram of an IC device 400, according to an embodiment. IC device 400 is substantially similar to IC device 200 shown in FIGS. 2 and 3 except that IC die 102 is replaced with an IC die 402 that is provided in a die up configuration. For example, as shown in FIG. 4, IC die 402 is coupled to substrate 108 through an adhesive 404. Moreover, as shown in FIG. 4, wire bonds 406 can electrically connect conductive regions 409 on the top surface of IC die 402 to conductive regions 408 on the surface of substrate 108. Similar to conductive regions 303 described with reference to FIG. 3, conductive regions 408 can be coupled to respective ones of solder balls 210 using one or more of vias 304, metal traces 306, or patterned metal layers (not shown in FIG. 4).

Figure 5:
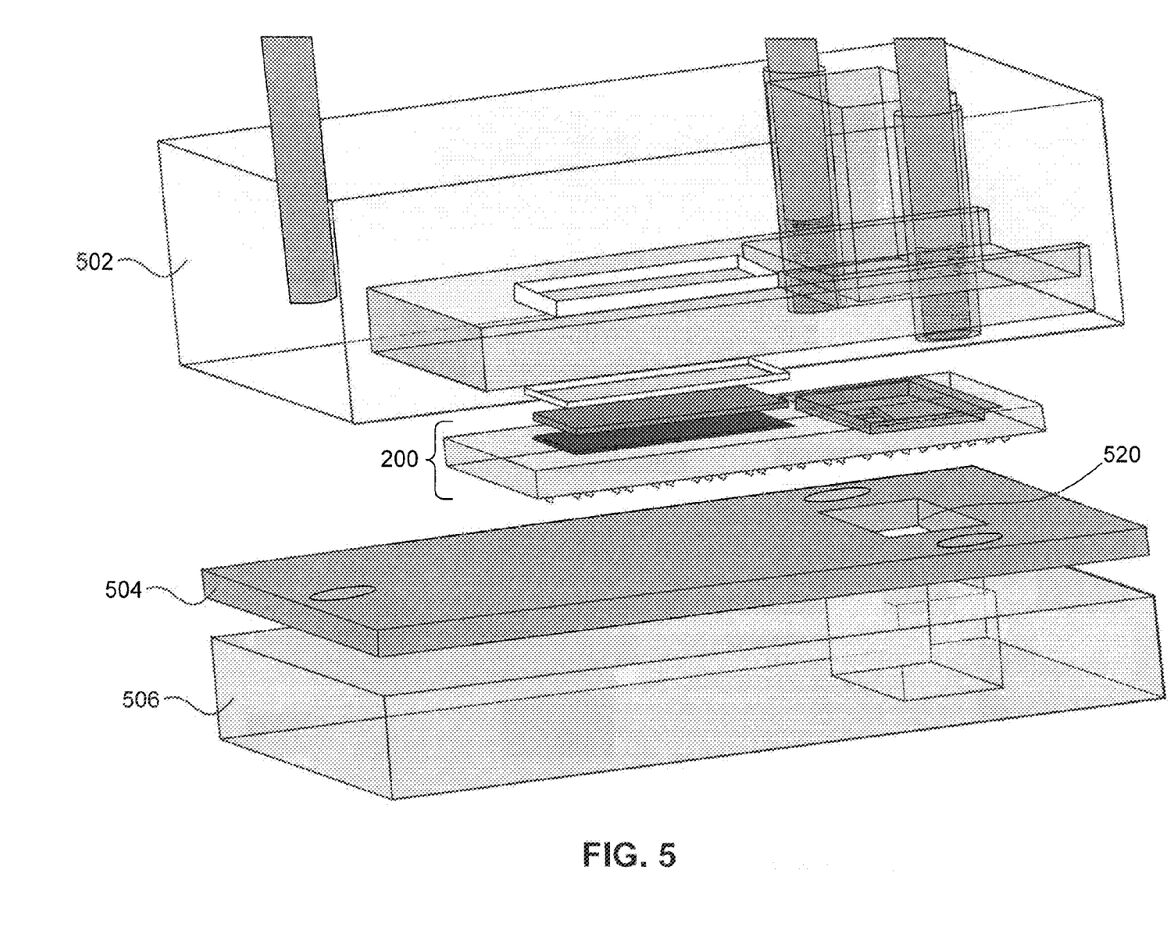
FIG. 5 shows a blow up view of an IC package, according to an embodiment.

FIG. 5 shows a blow up view of an IC package 500, according to an embodiment. As shown in FIG. 5, IC package 500 includes a housing 502, IC device 200, a printed circuit board (PCB) 504, and a chassis 506. As shown, the housing 502 includes a waveguide portion that is driven by the waveguide launcher 106. The PCB 504 includes an opening 520 that is sized consistent with the cavity 214 of the IC device 200, so as to support a further cavity in the housing 506, as will be described in later drawings. Each of the components of IC package 500 will be described in greater detail with reference to FIGS. 6-9.

Figure 6:
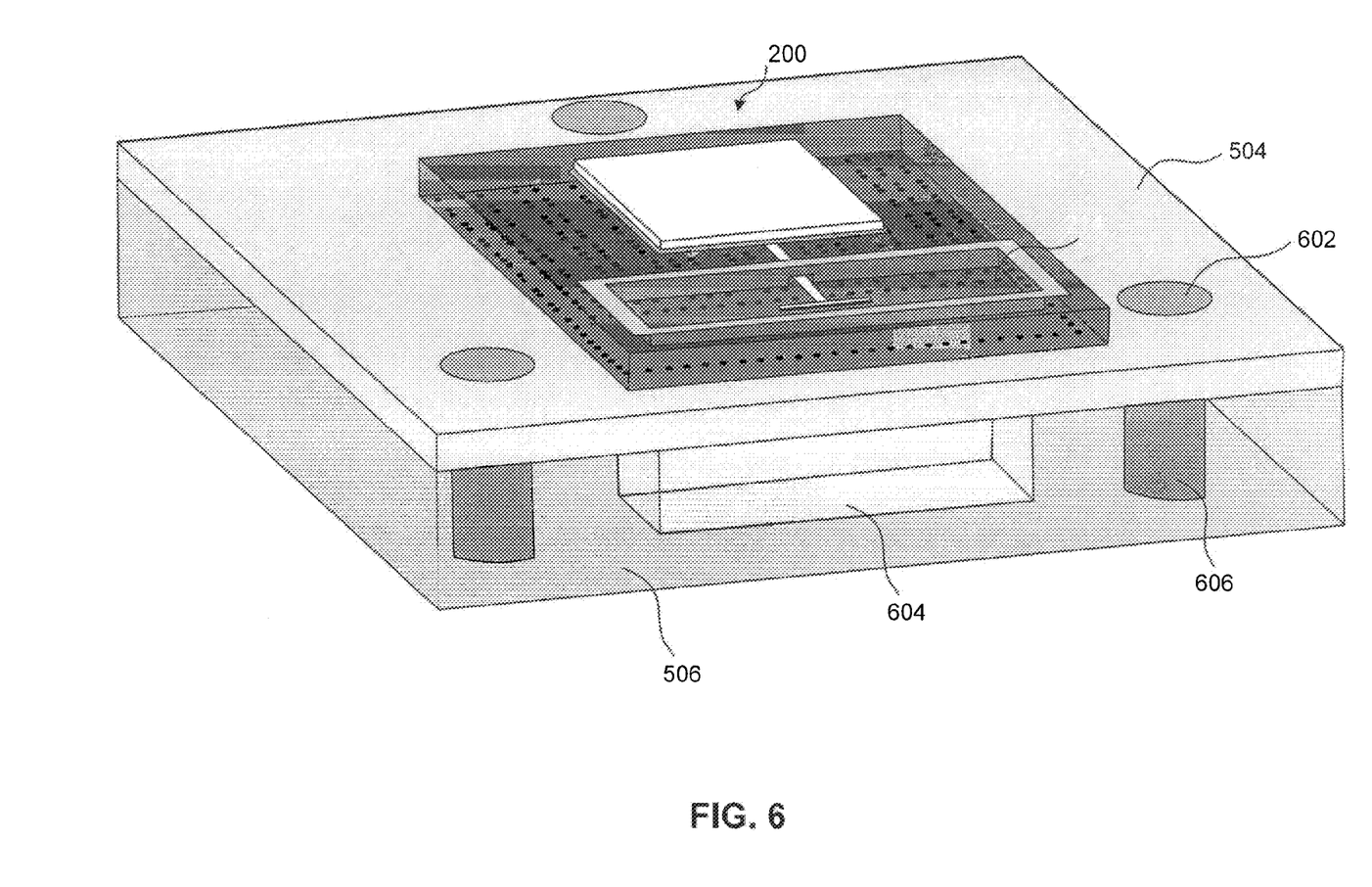
FIG. 6 shows an isometric view of an IC package, according to an embodiment.

FIG. 6 shows an isometric view of a portion of IC package 500, according to an embodiment. As shown in FIG. 6, IC device 200 is mounted to PCB 504. In an embodiment and as noted above, solder balls 210 can be coupled to respective conductive regions on PCB 504. PCB 504 can be formed out of a variety of different materials known to those skilled in the relevant arts for PCB construction, e.g., FR-4. For example, PCB 504 can include a dielectric material interspaced between metal layers. The metal layers can be electrically coupled through vias. Moreover, one or more of the metal layers can be patterned.

As shown in FIG. 6, PCB 504 includes screw holes 602. In an embodiment, screw holes 602 can be configured to accommodate a screw that passes through housing 502, PCB 504, and anchors in chassis 506. The screw can be used to enhance the structural stability of IC package 500 and to provide relatively high galvanic conductivity between PCB 504 and chassis 506. Although the embodiment of FIG. 6 shows PCB 504 as including three screw holes. Those skilled in the relevant art will appreciate that PCB 504 can include other numbers of holes in other embodiments.

Chassis 506 can be formed out of a metallic material, e.g., copper or aluminum. As shown in FIG. 6, chassis 506 includes a cavity 604. Cavity 604 substantially coincides with cavity 214 of IC device 200. Cavity 604 can operate as a resonator for waveguide launcher 106 of IC device 200 (not numerically referenced in FIG. 6). In a further embodiment, cavity 604 can be especially useful for relatively low frequencies, but may be omitted for relatively high frequencies (e.g., 18 GHz).

In a further embodiment, PCB 504 can also include an opening that coincides with cavities 214 and 604. For example, as shown in FIG. 5, PCB 504 can include an opening 520 that coincides and aligns with the cavity 604 of chassis 506 and cavity 214 of IC device 200. Therefore, in one embodiment, the outline of opening 520 and the outline of chassis cavity 604 substantially mirror (or track) that of the substrate cavity 214.

Figure 7:
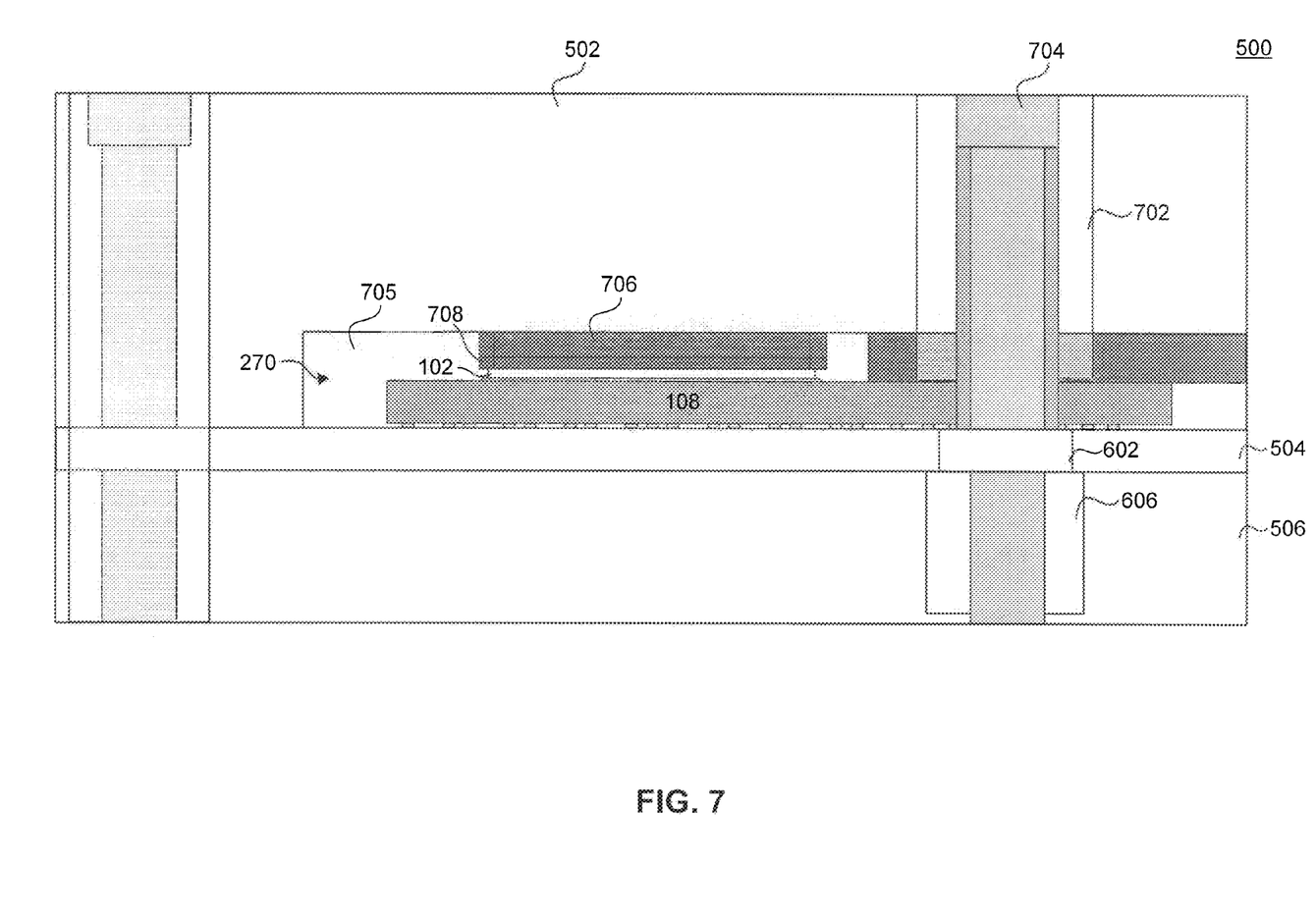
FIG. 7 shows a cross-sectional view of an IC package, according to an embodiment.

FIG. 7 shows a cross sectional view of IC package 500, according to an embodiment. As shown in FIG. 7, housing 502 includes screw holes 702 that correspond to screw holes 602 of PCB 504 and screw holes 606 of chassis 506. Moreover, as also shown in FIG. 7, screws 704 can be inserted through screw holes 702, 602, and 606. As noted above, screws 704 can be used to enhance the structural stability of IC package 500 by increasing the coupling between housing 502, PCB 504 and chassis 506. In addition, screws 704 can also increase the galvanic conductivity between PCB 504 and metal chassis 506.

As also shown in FIG. 7, IC device 200 is included within a cavity 705 formed in housing 502. In an embodiment, housing 502 is formed out of an electrically conductive material, such as a metal. Cavity 705 can be constructed and arranged to accommodate IC device 200. In an embodiment, cavity 705 can be air-filled or it can be filled within an encapsulation material.

Housing 502 also includes a heat spreader 706 coupled to IC die 102 of IC device 200 through grease 708. As shown in FIG. 7, heat spreader 706 is implemented as a thermal pedestal. However, in alternate embodiments, heat spreader 706 can take on other shapes that allow for thermal conduction from IC die 102 to housing 502. Grease 708 can be used to facilitate the thermal conduction from IC die 702 to heat spreader 706. In alternate embodiments, other thermally conductive materials can be used to provide a thermally conductive path between IC die 102 and housing 502.

In an embodiment, housing 502 and chassis 506 can be formed out of the same material, e.g., out of the same metal. In alternate embodiments however, housing 502 and chassis 506 can be formed from different materials, e.g., different metals.

Figure 8:
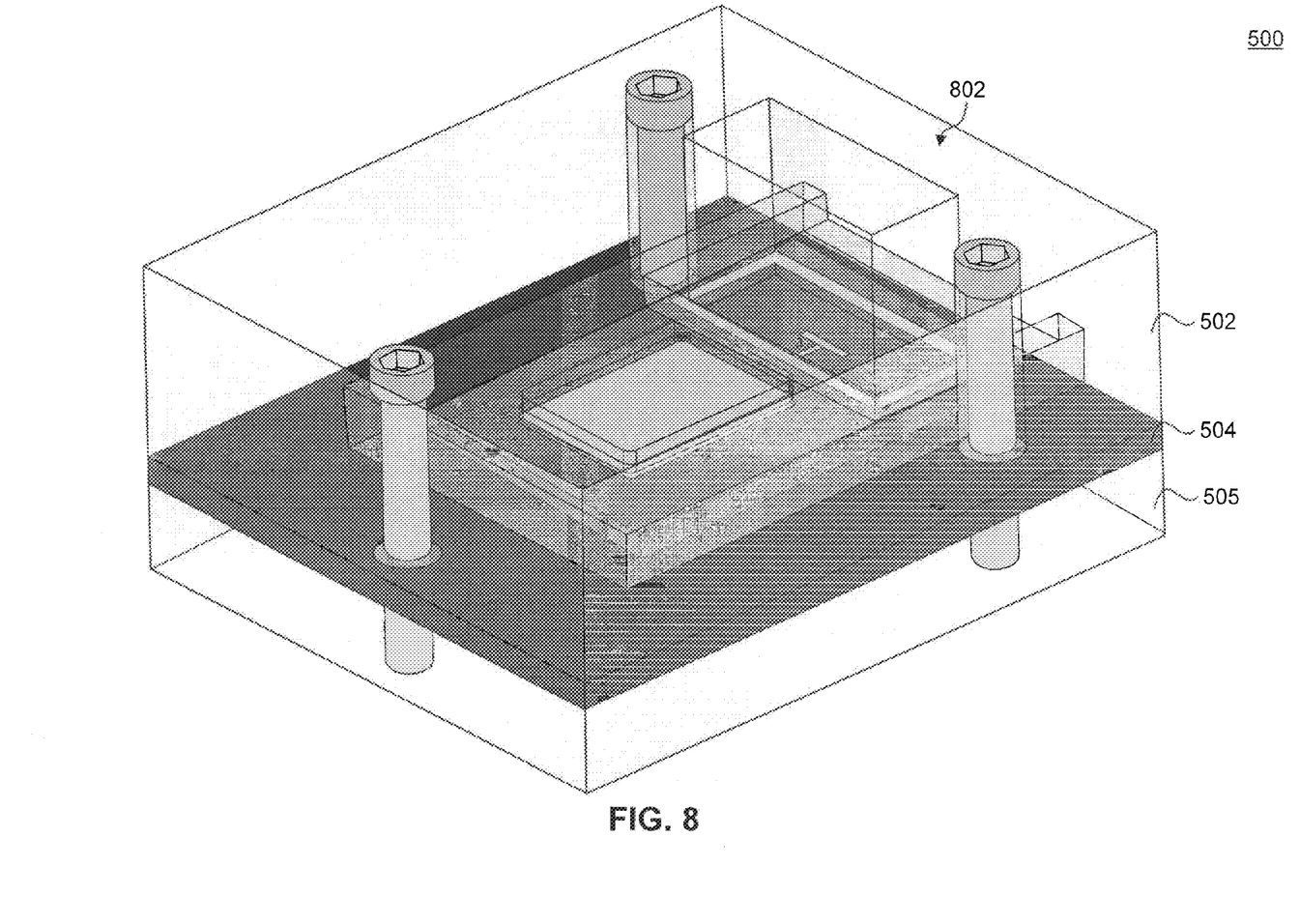
FIG. 8 shows a perspective view of an IC package, according to an embodiment.

FIG. 8 shows a perspective view of IC package 500, according to an embodiment. As shown in FIG. 8, housing 502 includes a waveguide 802. Waveguide 802 is a rectangular waveguide whose dimensions substantially coincide with cavity 214 of IC device 200. Waveguide launcher 106 of IC device 200 can be configured to radiate into waveguide 802 and to receive radiation from waveguide 802. Although waveguide 802 is shown to have a substantially rectangular cross section, in alternate embodiments, waveguides with other cross-sections can be used. Thus, IC die 102 (not numerically referenced in FIG. 8) can communicate with other devices in two ways: through solder balls 210 and through waveguide 802.

Figure 9:
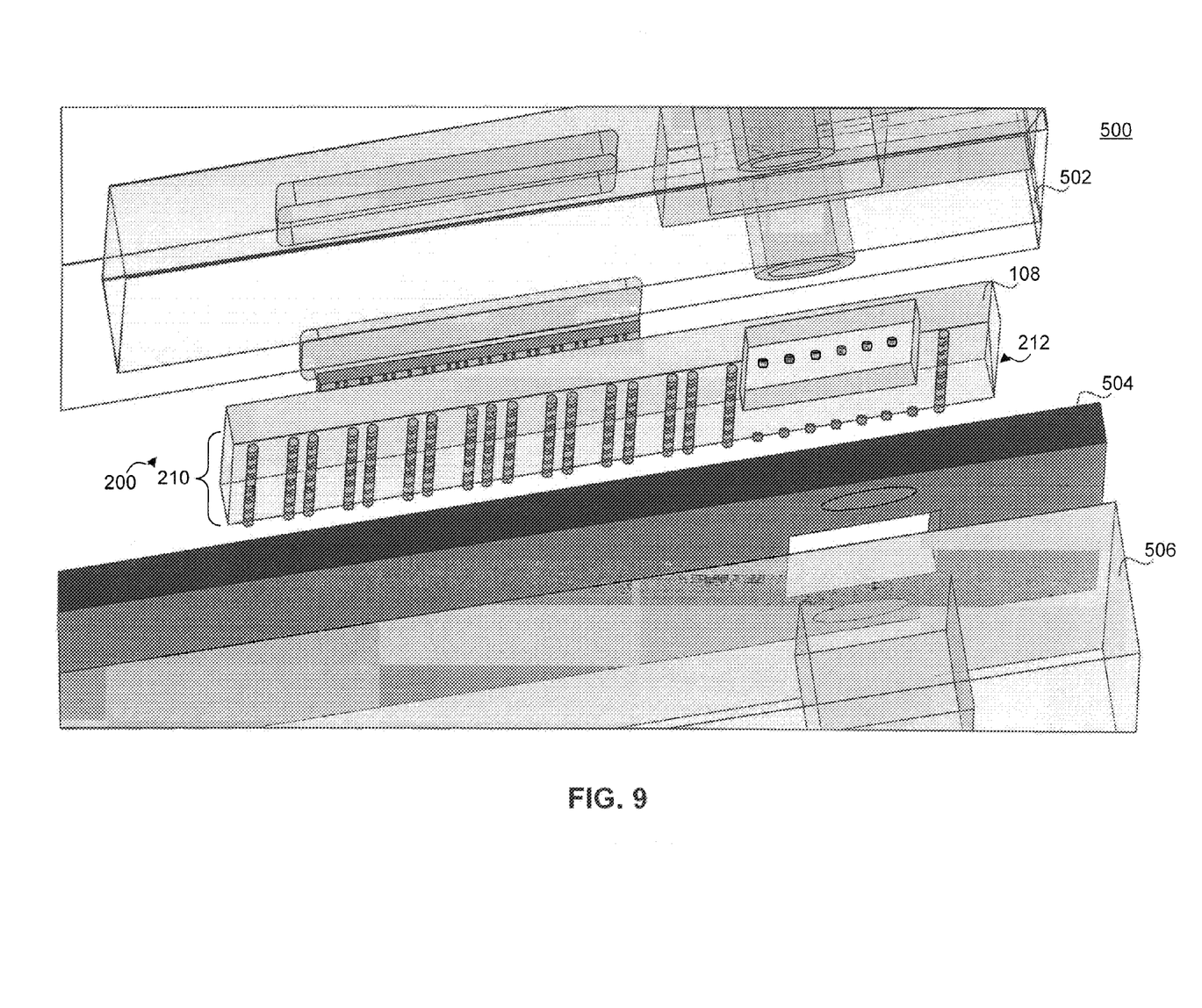
FIG. 9 shows a bottom perspective view of IC package, according to an embodiment.

FIG. 9 shows a bottom perspective view of IC package 500, according to an embodiment. As shown in FIG. 9, solder balls 210 populate the bottom surface of substrate 108. Solder balls 212 are arranged along the parameter of cavity 214 and has a relatively small pitch compared to other solder balls patterns.

Figure 10:
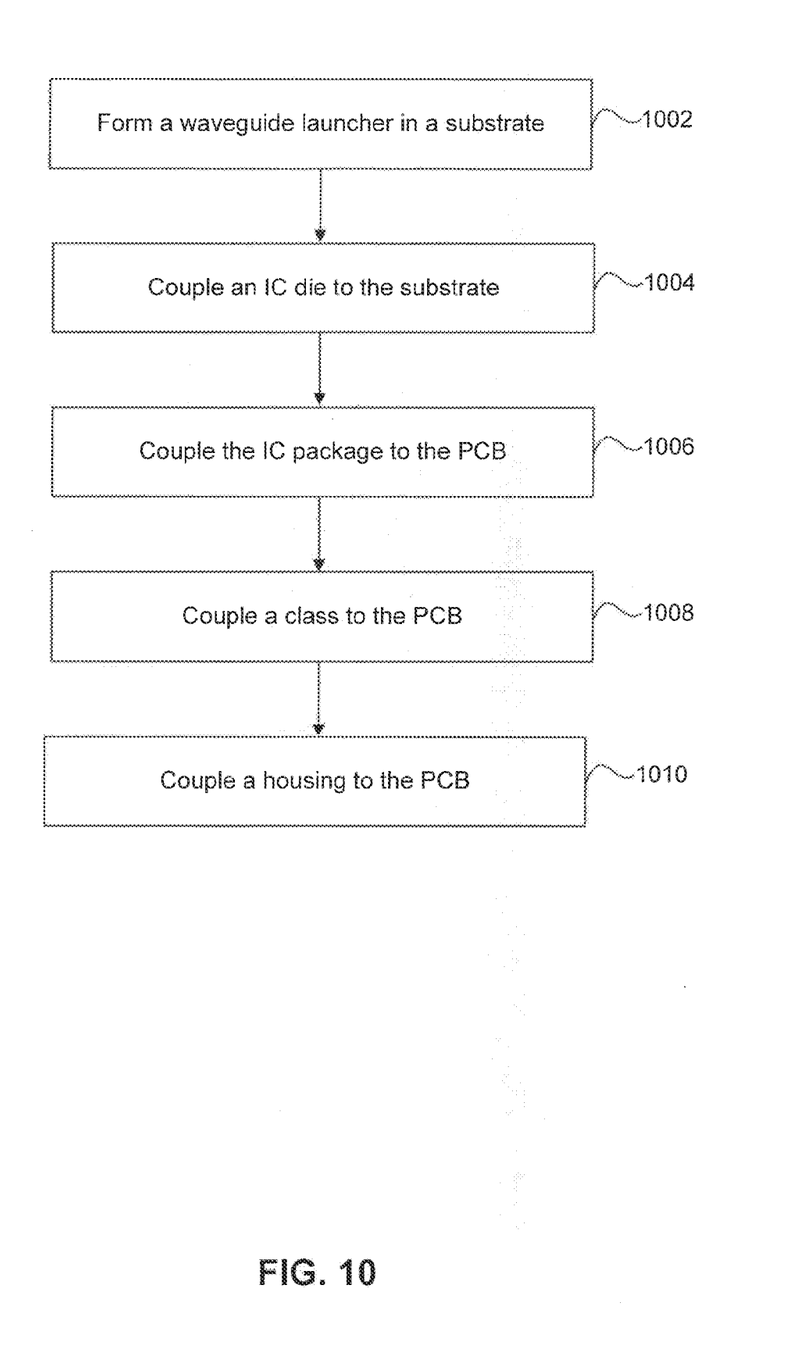
FIG. 10 is flowchart of a method of manufacturing a device, according to an embodiment.

FIG. 10 shows a method of manufacturing an IC device, according to an embodiment. Not all steps of method 1000 may be required, nor do all of these steps shown in FIG. 10 necessarily have to occur in the order shown.

In step 1002, a waveguide launch is formed in a substrate. For example, in FIG. 1, waveguide launcher 106 can be formed in substrate 108. For example, waveguide launcher 106 can be formed as a combination of metal traces. In a further embodiment, the waveguide launcher can be formed in a cavity formed in a substrate. For example, in FIG. 2, waveguide launcher 106 can be formed in cavity 214 of substrate 108. As shown in FIG. 2, waveguide launcher 106 can include a first portion 202 and a second portion 204. In an embodiment both first and second portions 202 and 204 can be formed as metal traces and have a length of approximately a quarter wavelength. Moreover, as noted above, the depth of cavity 214 can be approximately a quarter wavelength.

In step 1004, an IC die is coupled to the substrate. For example, in FIG. 1, IC die 102 can be coupled to substrate 108. In an embodiment, the IC die can be coupled to the substrate in a flip-chip configuration. For example, in FIG. 3, IC die 102 is coupled to substrate 108 in a flip chip configuration in which solder bumps 302 electrically couple conductive regions on IC die 102 to conductive regions 303 on substrate 108. In an alternate embodiment, the IC die can be coupled to the substrate in a die up configuration. For example, in FIG. 4, IC die 402 is coupled to substrate 108 through wire bonds 406.

In step 1006, the IC package is coupled to a PCB. For example, in FIG. 6, IC device 200 can be mounted to PCB 504.

In step 1008, a chassis is coupled to the PCB. In step 1010, a housing can be coupled to the PCB.

For example, as shown in FIG. 7, a screw that passes through screw holes 702, 602 and 606 can be used to couple the housing and the chassis to PCB 504. Additionally or alternatively, an adhesive can be used to couple housing 502 and/or chassis 506 to respective surfaces of PCB 504. As noted above, the housing can include a waveguide that is configured to guide radiation generated by the waveguide launcher.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. An integrated circuit (IC) device, comprising:
   a semiconductor substrate having an outer surface and being configured to be coupled to a printed circuit board (PCB), the semiconductor substrate having a cavity formed therein below the outer surface of the semiconductor substrate, the cavity having a sidewall and a planar surface, wherein the cavity is open at the outer surface of the semiconductor substrate;
   an IC die attached to the outer surface of the semiconductor substrate;
   a waveguide launcher formed on the semiconductor substrate, the waveguide launcher including a metal trace that passes through the sidewall and contacts the planar surface of the cavity,
   wherein the waveguide launcher is electrically coupled to the IC die through the semiconductor substrate.

2. The IC device of claim 1, further comprising a plurality of bumps that electrically couples the IC die to the outer surface of the semiconductor substrate.

3. The IC device of claim 1, further comprising a plurality of wire bonds that electrically couples the IC die to the outer surface of the semiconductor substrate.

4. The IC device of claim 1, further comprising a ground ring formed on the outer surface of the semiconductor substrate, the ground ring comprising a plurality of traces that together surround the cavity.

5. The IC device of claim 4, further comprising a plurality of solder balls coupled to a second outer surface of the semiconductor substrate, wherein at least one of the plurality of solder balls is electrically coupled to the ground ring.

6. The IC device of claim 5, wherein the semiconductor substrate comprises at least one via that electrically couples the at least one of the plurality of solder balls to the ground ring.

7. The IC device of claim 1, further comprising the PCB, the PCB being coupled to the semiconductor substrate.

8. The IC device of claim 7, further comprising a chassis coupled to the PCB.

9. The IC device of claim 8, wherein the chassis comprises a cavity that substantially corresponds with the cavity of the semiconductor substrate.

10. The IC device of claim 9, wherein the PCB comprises an opening that substantially corresponds with the cavity of the chassis and the cavity of the semiconductor substrate.

11. The IC device of claim 7, further comprising a housing coupled to the PCB.

12. The IC device of claim 11, wherein the housing comprises a waveguide formed therein, wherein the waveguide launcher is configured to radiate into the waveguide.

13. The IC device of claim 11, wherein the housing comprises a screw hole that is aligned with a screw hole formed in the PCB.

14. The IC device of claim 13, further comprising a chassis coupled to the PCB, wherein the chassis comprises a screw hole that is aligned with the screw hole of the housing and the screw hole of the PCB.

15. The IC device of claim 11, wherein the housing comprises a heat spreader that is in thermal contact with the IC die.

16. A method of manufacturing an integrated circuit (IC) device, comprising:
   forming a waveguide launcher in a cavity of a semiconductor substrate, the cavity being formed in the semiconductor substrate beneath an outer surface of the semiconductor substrate and having a sidewall and a planar surface, wherein the semiconductor substrate is configured to be coupled to a printed circuit board (PCB), wherein the cavity is open at the outer surface of the semiconductor substrate and wherein the waveguide launcher includes a metal trace that passes through the sidewall and contacts the planar surface of the cavity; and coupling an IC die to the outer surface of the semiconductor substrate, wherein the IC die is electrically coupled to the waveguide launcher through the semiconductor substrate.

17. The method of claim 16, further comprising:
coupling the IC die to the PCB.

18. The method of claim 17, further comprising:
coupling a chassis to the PCB.

19. The method of claim 17, further comprising:
coupling a housing to the PCB.

20. The IC device of claim 1, wherein a depth of the cavity is approximately equal to a quarter of a wavelength at which the waveguide launcher is configured to transmit radiation.

* * * * *